United States Patent [19]
Casey, Jr. et al.

[11] 3,974,002
[45] Aug. 10, 1976

[54] MBE GROWTH: GETTERING CONTAMINANTS AND FABRICATING HETEROSTRUCTURE JUNCTION LASERS

[75] Inventors: Horace Craig Casey, Jr., Summit; Alfred Yi Cho, New Providence; Morton B. Panish, Springfield, all of N.J.

[73] Assignee: Bell Telephone Laboratories, Incorporated, Murray Hill, N.J.

[22] Filed: June 10, 1974

[21] Appl. No.: 477,975

[52] U.S. Cl. .............................. 148/175; 148/174; 148/1.5; 427/85; 252/62.3 GA
[51] Int. Cl.² ............................................. H01L 7/36
[58] Field of Search ............... 148/175, 174, 1.5; 117/215; 252/62.3 GA

[56] References Cited
UNITED STATES PATENTS

| | | | |
|---|---|---|---|
| 3,347,719 | 10/1967 | Heywang | 148/187 |
| 3,470,038 | 9/1969 | Logan et al. | 148/171 |
| 3,604,991 | 9/1971 | Yonezu | 148/171 X |
| 3,635,771 | 1/1972 | Shaw | 148/175 |
| 3,647,389 | 3/1972 | Weiner | 148/1.5 X |
| 3,666,553 | 5/1972 | Arthur et al. | 148/1.5 X |
| 3,691,476 | 9/1972 | Hayashi | 148/175 X |
| 3,824,133 | 7/1974 | D'Asaro et al. | 148/1.5 |
| 3,839,084 | 10/1974 | Cho et al. | 148/175 X |

*Primary Examiner*—G. Ozaki
*Attorney, Agent, or Firm*—M. J. Urbano

[57] ABSTRACT

In the fabrication of double heterostructure GaAsAlGaAs junction lasers by molecular beam epitaxy, it has been found that suitably annealing the entire heterostructure increases the external quantum efficiency of the laser and reduces the room temperature threshold for lasing. Also described is a technique using relatively uncollimated beams to deposit continuously on the interior walls of the vacuum chamber fresh layers which getter deleterious contaminants. In addition, pyrolytic boron nitride, rather than graphite, effusion cells are utilized in order to reduce the amount of CO formation in the system.

10 Claims, 4 Drawing Figures

MBE GROWTH: GETTERING CONTAMINANTS AND FABRICATING HETEROSTRUCTURE JUNCTION LASERS

BACKGROUND OF THE INVENTION

This invention relates to the fabrication of heterostructure optical devices, such as semiconductor junction lasers, by molecular beam epitaxy (MBE).

In U.S. Pat. No. 3,615,931 granted to J. R. Authur, Jr. on Oct. 26, 1971 and assigned to the assignee hereof, there is described a comparatively new technique for the epitaxial growth of thin films of semiconductor materials, in which growth results from the simultaneous impingement of one or more molecular beams of the constituent elements onto a heated substrate. In particular the Arthur patent describes the basic MBE process for growing Group III(a)–V(a) thin films on a substrate preheated to a temperature within the range of about 450°–650° Centigrade and maintained at subatmospheric pressure. In U.S. Pat. No. 3,751,310 granted to A. Y. Cho on Aug. 7, 1973, there is described an MBE technique for doping such Group III(a)–V(a) thin films with Sn and Si, which act as donors, and with Ge, which is amphoteric depending on whether the growth surface structure is stabilized (i.e., rich) in the Group III(a) element (p-type) or the Group V(a) element (n-type). In addition, in copending application Ser. No. 310,209 (A. Y. Cho–M. B. Panish) filed on Nov. 29, 1972 (now U.S. Pat. No. 3,839,084) there is described a recent MBE technique for making Group III(a)–V(a) thin films p-type by doping with Mg.

One of the initial motivations for investigating MBE was the ability to fabricate thin epitaxial layers for optoelectronic devices because precise control of layer thickness and uniformity over a large area is readily achieved with MBE. Prior attempts to fabricate semiconductor devices, such as junction lasers, consistently met one recurring problem—anomalously high series resistance (e.g. 1000 ohms). In copending application Ser. No. 373,023 (A. Y. Cho–F. K. Reinhart), filed on June 25, 1973, relatively low series resistance (e.g., 2 ohms) in junction lasers and other devices has been achieved when one or more of the following steps are executed in the MBE technique: (1) on the substrate a high conductivity buffer layer is first grown having the same conductivity type as the substrate; (2) beginning with the buffer layer and until all semiconductor layers of the device are fabricated, the growth process is made to be continuous; and (3) the substrate is heated just prior to the growth of the high conductivity layer while a molecular beam of any element (e.g., arsenic) in the substrate having a relatively high vapor pressure impinges upon the substrate surface in order to suppress the loss of the element from the substrate.

SUMMARY OF THE INVENTION

Notwithstanding the important advances in MBE fabrication techniques defined by the foregoing patents and copending applications, our experience has been that double heterostructure junction lasers fabricated by MBE typically had lasing thresholds at room temperature which were significantly higher (e.g., by a factor of ten) than similar lasers fabricated by liquid phase epitaxy (LPE). Consequently, the DH lasers grown by MBE had thresholds which were too high for continuous wave operation at room temperature. We have found in addition, however, that suitably annealing the DH lasers grown by MBE significantly increases the external quantum efficiency and significantly reduces the room temperature lasing threshold. The observed increase in quantum efficiency for the annealed lasers suggests that annealing has removed nonradiative recombination centers, either at the heterostructure interfaces which bound the active region or within the active region itself.

Due to the high reactivity of Al, which is used in the fabrication of AlGaAs layers, we have also found it important to reduce as much as possible the amount of deleterious contaminants (e.g., $H_2O$, $CO$, $O_2$ and hydrocarbons) in the vacuum system in which the DH lasers are grown. To this end we utilized pyrolytic boron nitride, rather than graphite, effusion cells and, in addition, we utilized relatively uncollimated beams so that a portion of the beams (e.g., Al and Mg) continuously formed fresh layers on the interior wall of the vacuum chamber which effectively gettered the deleterious contaminants. Rather than using uncollimated beams, the gettering layers may be deposited by means of a separate effusion cell directed at the interior wall.

Note that for convenience we frequently utilize the abbreviation AlGaAs to mean $Al_xGa_{1-x}As$.

BRIEF DESCRIPTION OF THE DRAWING

Our invention, together with its various features and advantages, can be easily understood from the following more detailed description taken in conjunction with the accompanying drawing, in which.

DETAILED DESCRIPTION

Apparatus

Figure 1:
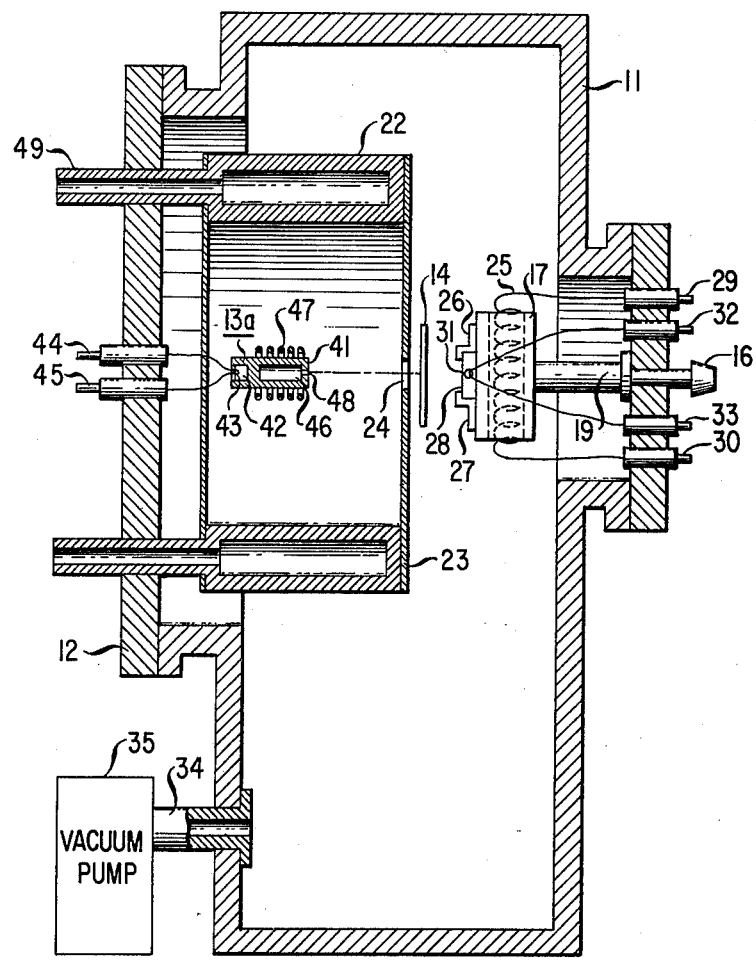
FIG. 1 is a partial cross-sectional view of illustrative apparatus utilized in practicing our invention.
Figure 2:
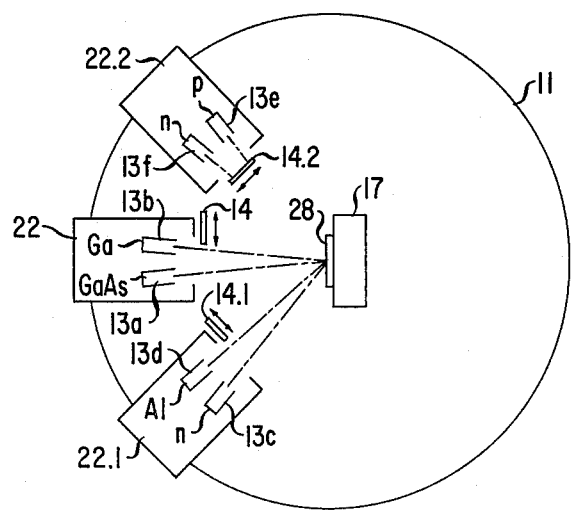
FIG. 2 is a schematic top view of only the primary components of apparatus of the type shown in FIG. 1.

Turning now to FIGS. 1 and 2, there is shown apparatus for growing by MBE epitaxial thin films of semiconductor compounds of controllable thickness and conductivity type.

The apparatus comprises a metal vacuum chamber 11 having disposed therein a gun port 12 containing illustratively six cylindrical guns 13a–f, typically Knudsen effusion cells, thermally insulated from one another by wrapping each cell with heat shielding material not shown (e.g., five layers of 0.5 mil thick knurled Ta foil). A substrate holder 17, typically a molybdenum block, is adapted for rotary motion by means of shaft 19 having a control knob 16 located exterior to chamber 11. Good thermal contact between the substrate and the molybdenum block is illustratively made via a layer of indium (not shown). Each pair of guns (13a–b, 13c–d, 13e–f) are disposed within cylindrical liquid nitrogen cooling shrouds 22, 22.1 and 22.2 respectively. In the prior art a typical shroud includes an optional collimating frame 23 having a collimating aperture 24. A movable shutter 14 is utilized to block aperture 24 at preselected times when it is desired that a particular molecular beam not impinge upon the substrate. Substrate holder 17 is provided with an internal heater 25 and with clips 26 and 27 for affixing a substrate member 28 thereto. Heater 25 is coupled externally via connectors 29–30. Additionally, a thermocouple is disposed in aperture 31 in the side of substrate 28 and is coupled externally via connectors 32–33 in order to sense the temperature of substrate 28. Chamber 11 also includes an outlet 34 for evacuating the chamber by means of a pump 35.

A typical cylindrical gun 13a comprises a refractory crucible 41 having a thermocouple well 42 and a thermocouple 43 inserted therein for the purpose of determining the temperature of the material contained in the gun source chamber 46. Thermocouple 43 is connected to an external detector (not shown) via connectors 44–45. Source material is inserted in source chamber 46 for vaporization by heating coil 47 which surrounds the crucible. In the prior art the end of crucible 41 adjacent aperture 24 is provided with a knife-edge opening 48 having a diameter preferably less than the average mean free path of atoms in the source chamber. Illustratively, gun 13a is 0.65 cm in diameter, 2.5 cm in length, is constructed of $Al_2O_3$ and is lined with spectroscopically pure graphite. The area of opening 48 is typically about 0.17 cm$^2$.

In accordance with one aspect of our invention, however, the guns are made of pyrolytic BN and neither collimating frame 23 nor the knife-edge opening 48 are utilized so that certain beams (e.g., Al, Mg) are sufficiently uncollimated that a relatively large portion of the beams strike the interior wall of the chamber 11 to continuously form fresh layers thereon which getter deleterious contaminants (e.g., $H_2O$, CO, $O_2$ and hydrocarbons) as discussed herinafter.

Note that the removal of the frame 23 and knife-edge opening 48 does not change the fundamental character of the molecular beams; i.e., the arrival rate of the beam at the substrate is substantially constant once the gun temperature is fixed. This characteristic is maintained as long as the aperture if the gun is sufficiently small; e.g., the gun has a diameter of 0.65 cm and a length of 2.5 cm as before.

General MBE Technique

For the purposes of illustration only, the following description relates to the epitaxial growth of a thin film of a Group III($a$)–V($a$) compound on a GaAs substrate.

The first step in a typical MBE technique involves selecting a single crystal substrate member, such as GaAs, which may readily be obtained from commercial sources. One major surface of the GaAs substrate member is initially cut typically along the (001) plane and polished with diamond paste, or any other conventional technique, for the purpose of removing gross surface damage therefrom. An etchant such as a bromine-methanol of hydrogen peroxide-sulphuric acid solution is employed for the purpose of further removing surface damage and to produce a clean substrate surface subsequent to polishing.

Next, the substrate is placed in an apparatus of the type shown in FIGS. 1 and 2, and thereafter, the background pressure in the vacuum chamber is reduced to less than $10^{-6}$ Torr and preferably to a value in the range of about $10^{-8}$ to $10^{-10}$ Torr; thereby reducing the likelihood that deleterious contaminants are introduced onto the substrate surface. Since, however, the substrate surface may be subject to atmospheric contamination before being mounted into the vacuum chamber, the substrate is preferably heated, e.g., to about 600° Centigrade, to provide a substantially atomically clean growth surface (i.e., desorption of contaminants such as S, $O_2$ and $H_2O$). The next steps in the process involve introducing liquid nitrogen into the cooling shrouds via entrance ports 49 and heating the substrate member to the growth temperature which typically ranges from about 450° to 650° Centigrade dependent upon the specific material to be grown, such range being dictated by considerations relating to arrival rates and surface diffusion.

The guns 13$a$–$f$, employed in the system, have previously been filled with the requisite amounts of the constituents of the desired film to be grown, e.g., gun 13$a$ contains a Group III($a$)–V($a$) compound such as GaAs in bulk form or pure As; gun 13$b$ contains a Group III($a$) element such as Ga; guns 13$c$ and 13$f$ contain an n-type dopant such as Sn, Si or Ge in bulk form and; gun 13$c$ contains a p-type dopant such as Mg or Ge. In the practice of our present invention, when it is desired to grow a mixed crystal such as AlGaAs, gun 13$d$ containing Al is also used. The manner in which Sn and Si are used as n-type dopants and Ge is used as an amphoteric dopant in the growth of Group III($a$)–V($a$) compounds by MBE is disclosed by A. Y. Cho in U.S. Pat. No. 3,751,310, supra. On the other hand, the manner in which Mg is used as a p-type dopant in the growth of Group III($a$)–V($a$) compounds containing Al is disclosed in Cho-Panish U.S. Pat. No. 3,839,084, supra.

Following, selected ones of the guns are heated to suitable temperature (not necessarily all the same) sufficient to vaporize the contents thereof to yield (with selected ones of the shutters open) a molecular beam (or beams). Vaporization may occur by evaporation or sublimation depending on whether the gun temperature is above or below, respectively, the melting point of the contents. The distances from the guns to the substrate is typically about 7 cm for a growth area of 2 cm × 2 cm. Under these conditions growth rates from 1000 Angstroms/hr. to 2 $\mu$m/hr. can readily be achieved by varying the temperature of the Ga gun from 1110° to 1210° Keluin.

In general the amount of source materials (e.g., Ga, Al and GaAs) furnished to the guns and the gun temperatures should be sufficient to provide an excess of the higher vapor pressure Group V($a$) elements (e.g., As) with respect to the lower vapor pressure Group III($a$) elements (e.g., Al and Ga); that is, the surface should be As-rich (also referred to as As-stabilized). This condition arises from the large differences in sticking coefficient at the growth temperature of the several materials; namely, unity for Ga and Al and about $10^{-2}$ for $As_2$ on a GaAs surface, the latter increasing to unity when there is an excess of Ga (and/or Al) on the surface). Therefore, as long as the $As_2$ arrival rate is higher than that of Ga and/or Al, the growth will be stoichiometric. Similar considerations apply to Ga and $P_2$ beams impinging, for example, on a GaP substrate.

Growth of the desired doped epitaxial film is effected by directing the molecular beam generated by the guns at the substrate surface. Growth is continued for a time period sufficient to yield an epitaxial film of the desired thickness. This technique permits the controlled growth of films of thickness ranging from a single monolayer (about 3 Angstroms) to more than 100,000 Angstroms.

The reasons which dictate the use of the aforementioned temperature ranges can be understood as follows. Taking Group III($a$)-V($a$) compounds as an example, it is now known that Group III($a$)-V($a$) elements, which are adsorbed upon the surface of single crystal semiconductors, have different condensation and sticking coefficients as well as different adsorption lifetimes. Group V($a$) elements typically are also almost entirely reflected in the absence of III($a$) elements when the substrate is at the growth temperature. However, the growth of stoichiometric III($a$)-V($a$) semiconductor compounds may be effected by providing vapors of Group III($a$) elements at the substrate surface, an excess of Group V($a$) elements being present with respect to the III($a$) elements, thereby assuring that the entirety of the III($a$) elements will be consumed while the nonreacted V($a$) excess is reflected. In this connection, the aforementioned substrate temperatures range is related to the arrival rate and surface mobility of atoms striking the surface; i.e., the surface temperature must be high enough (e.g., greater than about 450° Centigrade) that impinging atoms retain enough thermal energy to be able to migrate to favorable surface sites (potential wells) to form the epitaxial layer. The higher the arrival rate of these impinging atoms, the higher must be the substrate temperature. On the other hand, the substrate surface temperature should not be so high (e.g., greater than about 650° Centigrade) that extensive noncongruent evaporation results. As defined by C. D. Thurmond in *Journal of Physics, Chem. Solids*, 26, 785 (1965), noncongruent evaporation is the preferential evaporation of the V($a$) elements from the substrate eventually leaving a new phase containing primarily the III($a$) elements. Generally, therefore congruent evaporation means that the evaporation rate of the III($a$) and V($a$) elements are equal. In practice, a growth temperature somewhat higher (e.g., 675° Centigrade) than the congruent evaporation temperature may be utilized because the effect of congruent evaporation is modified by the fact that a V($a$) beam is striking the substrate surface. The temperatures of the cell containing the III($a$) element and of the cell containing the III($a$)-V($a$) compound, which provides a source of V($a$) molecules, are determined by the desired growth rate and the particular III($a$)-V($a$) system utilized.

Double Heterostructure Fabrication

In order to fabricate double heterostructure (DH) lasers, we used the MBE apparatus shown in FIG. 2 which is adapted to permit continuous growth as described by Cho and Reinhart in application Ser. No. 373,023, supra. However, we made several modifications to the apparatus in order to reduce the likelihood that contaminants (e.g., CO, $H_2O$, $O_2$ and hydrocarbons) in the system would react with Al during the growth of AlGaAs layers. First, the effusion cells or guns 13$a$-13$f$ were all made of pyrolytic BN instead of graphite because graphite reacts with $H_2O$ to form CO which cannot be completely pumped out of the chamber. Second, the knife edges were removed from the guns (particularly the Al, Ga and/or Mg guns 13$d$, 13$b$ and 13$e$) and the collimating frame was also removed so that the beams emanating from the guns were relatively uncollimated. Thus, the portions of the beams which missed the substrate struck the interior wall of the chamber 11 and continuously formed fresh layers thereon. These layers effectively gettered contaminants such as CO, $H_2O$, $O_2$ and hydrocarbons reduced the likelihood that contaminants would react with Al in the epitaxial AlGaAs layers. Note that Al, Ga and Mg each getter contaminants so that any one of the three or any combination thereof can be used to form the getter layers. In addition, it is readily possible to employ a separate gun (not shown) for the sole purpose of depositing the getter layers instead of using the guns 13$d$, 13$b$ or 13$e$ for the dual purpose described above. Third, the continuously formed fresh layers also getter As so that in our system, for a growth rate of about 1 $\mu$m/hour, we empirically determined that with GaAs as the As source in gun 13$a$, the background As pressure should be in excess of about $6 \times 10^{-8}$ Torr, whereas with pure As as the As source in gun 13$a$, the background As pressure should exceed about $2 \times 10^{-7}$ Torr. These limits, however, are clearly system dependent.

The manner in which the apparatus so modified was used to fabricate the AlGaAs DH laser of FIG. 3B will now be given with reference to the following table.

| Step | Shutters | Guns Heated Open To Vaporization | Description |
|---|---|---|---|
| 1 | none | 13a - Ga<br>13b - GaAs<br>13f - Sn | produce excess As pressure at substrate, preheat to 560 deg. C. |
| 2 | 14,14.2 | 13a, 13b, 13f<br>13c - Sn (preheat)<br>13d - Al (preheat) | grow n-GaAs buffer layer |
| 3 | 14,14.1 | 13a, 13b, 13c, 13d<br>13e - Mg (preheat) | grow n-AlGaAs layer |
| 4 | 14,14.2 | 13a, 13b, 13e<br>13d - Al (preheat) | grow p-GaAs |
| 5 | 14,14.1,14.2 | 13a, 13b, 13d, 13e | grow p-AlGaAs |
| 6 | 14,14.2 | 13a, 13b, 13e | grow p-GaAs |

Note that during all growth steps (2–6) shutter 14 is open and GaAs-gun 13$a$ and Ga-gun 13$b$ are heated to produce vaporization, thereby effecting continuous growth. In step 3, Mg-gun 13$e$ is preheated with shutter 14.2 closed in anticipation of the growth of a p-type layer in step 4. Such preheating permits an abrupt change between contiguous layers of opposite conductivity type by substantially simultaneously closing shutter 14.1 and opening shutter 14.2 as the process proceeds from step 3 to 4 without interrupting the growth process. Similarly, in steps 2 and 4 Al-gun 13$d$ is preheated in anticipation of the growth of AlGaAs in steps 3 and 5, thereby allowing an abrupt change of composition between contiguous layers.

Figure 3A:
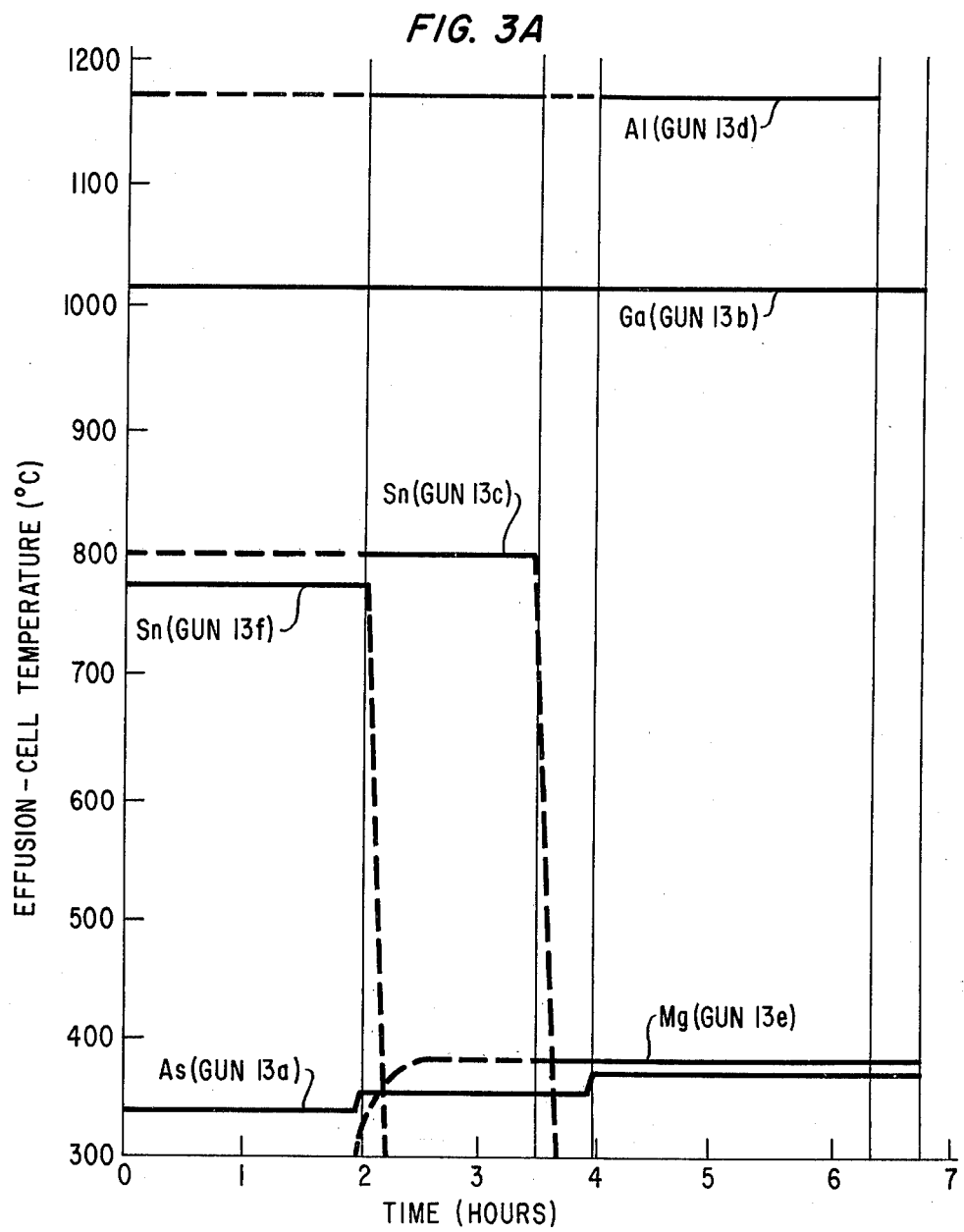
FIG. 3A is a graph showing the manner in which the MBE system is programmed as to effusion cell temperature and time in order to effect growth of the DH laser shown in FIG. 3B.

The specific manner in which the temperature of the guns and the opening and closing of the shutters is programmed to effect growth of the DH laser is also shown in FIG. 3A. The dotted lines indicate the temperature of guns behind closed shutters, and the solid lines indicate the temperature of guns when their respective shutters are open. It should be noted that with the same arrival rate of Mg, the acceptor concentration increases with increasing amounts of Al as discussed by Cho and Panish in U.S. Pat. No. 3,839,084, supra. In addition, in order to maintain a predetermined As pressure in the system, the As gun temperatures as shown in FIG. 3A was increased during the growth of both AlGaAs layers and layers doped with Mg because, as previously mentioned, both Al and Mg getter As and would otherwise result in a drastic decrease in As pressure.

Figure 3B:
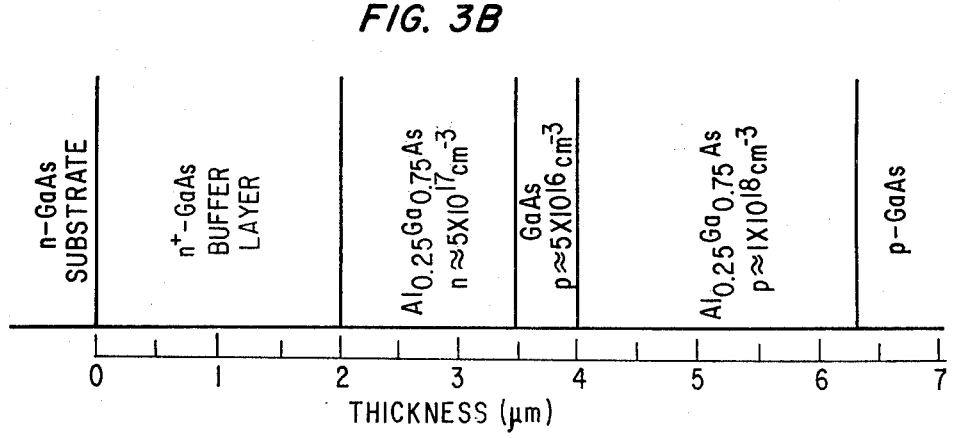
FIG. 3B shows schematically the various layers of a DH laser fabricated in accordance with one embodiment of our invention by utilizing an MBE technique programmed according to FIG. 3A.

The resulting DH laser, shown schematically in FIG. 3B, included the following contiguous layers in the order recited: a GaAs substrate doped n-type with Si or Te to $2 \times 10^{18}/cm^3$; a GaAs buffer layer 2.0 $\mu$m thick and doped n$^+$-type with Sn to $1 \times 10^{18}/cm^3$; an $Al_{0.25}Ga_{0.75}As$ layer 1.5 $\mu$m thick doped n-type with Sn to about $5 \times 10^{17}/cm^3$; a GaAs layer 0.53 $\mu$m thick (the active region) doped p-type with Mg to $5 \times 10^{16}/cm^3$; an $Al_{0.25}Ga_{0.75}As$ layer 2.3 $\mu$m thick doped p-type with Mg to about $1 \times 10^{18}/cm^3$; and a GaAs layer (used for electrical contacting) 0.5 $\mu$m thick doped p-type with Mg to about $5 \times 10^{16}/cm^3$.

The foregoing MBE double heterostructure was grown on 2cm × 2cm substrates which were large enough to permit extensive analysis on the same sample. Double-heterostructure lasers were prepared from sections of the wafer illustrated schematically in FIG. 3B. The threshold current density $J_{th}$ at room temperature (297°K) was $3.5 \times 10^4$ A/cm$^2$ for DH lasers prepared from an as-grown (i.e., unannealed) section. The active layer thickness was 0.53 $\mu$m, and the cavity length was 350 $\mu$m. (By comparison a DH laser of the same cavity length and active layer thickness grown by LPE typically has $J_{th} = 2.8 \times 10^3$ A/cm$^2$.) Annealing other sections of the sample reduced $J_{th}$ to $4.0 \times 10^3$ A/cm$^2$ and gave a differential quantum efficiency of 39 percent. For a cavity length of 730 $\mu$m, $J_{th}$ was $3.3 \times 10^3$ A/cm$^2$. Similar results were obtained by annealing at either 750° or 850° C for 2 hours. Annealing at 650° C for 2 hours, however, did not result in this reduction of $J_{th}$. Lasers were prepared from sections cut from different parts of the wafer. All of those sections annealed at 750° C or above gave lasers with similar properties.

Generally, the as-grown MBE DH lasers had a significant forward resistance which varied between individual devices. In fact, some had normal current-voltage (I–V) characteristics. However, in all cases, a normal I–V characteristic was obtained by "forming," i.e., momentarily applying a high (e.g., 3V) forward bias. No excess forward resistance was found for any annealed MBE DH lasers. The results of previous studies by Cho and Casey (*Journal of Applied Physics*, Vol. 45, page 1258 (1974)) suggest that this excess resistance occurs either within the n-type $Al_{0.25}Ga_{0.75}As$ layer or at one of its interfaces with the GaAs active region.

Besides the reduction of lasing threshold by a factor of 10, one of the most significant effects of annealing was a factor of 10 improvement of the quantum efficiency $\eta$ which increased in one case from $1.2 \times 10^{-4}$ to about $1.6 \times 10^{-3}$ after annealing. These values of $\eta$ are representative of those measured on numerous other DH lasers made from the same wafer, all of which had cross-sectional areas of about $5.4 \times 10^{-4}$ cm$^2$ and cavity lengths of 350 $\mu$m. The observed increase in quantum efficiency for the annealed lasers suggests that annealing has removed nonradiative recombination centers. However, it is not clear whether these centers are at the $Al_xGa_{1-x}As$-GaAs interfaces or in the active layer.

In another experiment we fabricated by the foregoing MBE technique similar DH lasers in which the AlGaAs layers contained 23 percent Al and the thickness of the p-GaAs:Mg active layer was about 0.12 $\mu$m. Lasers fabricated from the as-grown section had thresholds which were too high to permit lasing at room temperature. However, after annealing for 4 hours at 850° C, the threshold decreased to about $2.5 \times 10^3$ A/cm$^2$.

The annealing step of our procedure generally entailed placing the DH sample in a capsule in a vacuum chamber. Also placed in the capsule was a sufficient amount of As or Ga plus As to create an atmosphere in equilibrium with the sample when the sample was heated to the annealing temperature and the chamber pressure was reduced (e.g., to about $10^{-6}$ Torr). In one instance, 40 mg As per cubic centimeter of free volume in the capsule was found to be suitable, although this parameter is not critical.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, our invention is suitable to the MBE growth of other heterostructure light emitting devices such as LEDs, single heterostructure lasers (SH) as well as DH lasers. In general, it should be noted that DH lasers include a pair of wide bandgap $Al_xGa_{1-x}R$ layers of opposite conductivity type. R includes at least As, and may include other elements such as P (i.e., $Al_xGa_{1-x}As_{1-y}P_y$). Between layers of n-$Al_xGa_{1-x}R$ and p-$Al_xGa_{1-x}R$ there is the narrower bandgap active region comprising $Al_yGa_{1-y}R$, $0 \leq y < x$ and z which may be of either conductivity type or of both conductivity types. In addition, we believe that the foregoing beneficial effects of annealing apply generally to other luminescent materials grown by MBE. By way of example such materials include GaP, AlGaP and InGaAs.

What is claimed is:

1. A method for epitaxially growing upon a GaAs substrate surface a multilayered semiconductor junction laser device comprising the steps of:
    a. placing the substrate in a metal vacuum chamber and reducing the background pressure to at least $10^{-8}$ Torr approximately;
    b. just prior to step (c), preheating the substrate to a temperature in the range of about 450° to 675° Centigrade under a condition of excess As pressure at said surface;
    c. directing at least one first molecular beam comprising Ga, As and a dopant upon said surface to effect growth thereon of a GaAs buffer layer having a conductivity type the same as that of the substrate;
    d. directing at least one second molecular beam comprising at least a Group III(a) element, a Group V(a) element and a dopant upon said buffer layer for a time period sufficient to effect growth of said junction laser device;
    e. maintaining the relative proportions of the constituents of said first and second molecular beams so that at the growth surface thre is an excess of said Group V(a) elements with respect to said Group III(a) elements; and
    f. beginning with said step (c) and until said buffer layer and all the layers of said device are grown, maintaining said growth process continuous; characterized in that:

1. step ($d$) is effective to fabricate a double heterostructure including a first layer of n-$Al_xGa_{1-x}R$, $x > 0$, a second region of $Al_yGa_{1-y}R$, $0 \leq y < x$, and a third layer of p-$Al_zGa_{1-z}R$, $z > y$, where R includes at least As,
2. said heterostructure is annealed in an atmosphere substantially in equilibrium therewith at a temperature in the range of about 750° to 850°C and for a time effective to increase the quantum efficiency and reduce the lasing threshold of said device as compared to the efficiency and threshold thereof in the absence of said annealing, and
3. during step ($d$) fresh layers of a material selected from the group consisting of Ga, Mg and Al are formed continuously on an interior surface of said chamber effective to getter $O_2$, CO, $H_2O$ and hydrocarbon contaminants within said chamber.

2. The method of claim 1 wherein the portion of said at least one second molecular beam containing Al is sufficiently uncollimated that Al strikes said interior surface.

3. The method of claim 2 wherein said Al portion of said second beam is generated in an elongated cylindrical effusion cell having an aperture small enough that the arrival rate of Al at said substrate remains substantially constant once the cell temperature is fixed, yet large enough that the beam is sufficiently uncollimated to allow some Al to miss said substrate and to strike said interior surface.

4. The method of claim 1 including the step of increasing the background pressure of As during the growth of layers of said heterostructure containing Al.

5. The method of claim 1 wherein said second region and said third layer are both doped with Mg, and further characterized in that during step ($d$) fresh layers of Al and Mg are continuously formed on an interior surface of said chamber effective to getter said contaminants within said chamber.

6. The method of claim 5 including the step of increasing the background pressure of As during the growth of layers of said heterostructure containing either Al or Mg.

7. A method of fabricating an epitaxial semiconductor layer of a Group III($a$)-V($a$) compound material on a substrate surface comprising the steps of:
   a. placing the substrate in an evacuable metal chamber;
   b. reducing the pressure of said chamber to a subatmospheric pressure;
   c. preheating said substrate to a temperature suitable for epitaxial growth thereon;
   d. directing at least one molecular beam comprising the constituents of said layer upon said surface of said substrate for a time period effective to epitaxially grow said layer to a desired thickness; characterized by
   e. during step ($d$) directing at least one molecular beam at an interior surface of said chamber to continuously form thereon fresh layers effective to getter $O_2$, CO, $H_2O$ and hydrocarbon contaminants within said chamber.

8. The method of claim 7 further characterized in that said at least one molecular beam of step ($e$) is formed by heating the requisite thereof in at least one effusion cell separate from those used to form said at least one molecular beam of step ($d$).

9. The method of claim 7 further characterized in that said at least one molecular beam of step ($d$) is sufficiently uncollimated to form said at least one molecular beam of step ($e$).

10. The method of claim 9 further characterized in that said at least one molecular beam of step ($e$) is formed by heating in at least one effusion cell gettering material selected from the group consisting of Ga, Al and Mg or any combination thereof.

* * * * *

UNITED STATES PATENT AND TRADEMARK OFFICE
CERTIFICATE OF CORRECTION

PATENT NO. : 3,974,002
DATED : June 10, 1974
INVENTOR(S) : Horace C. Casey, Jr., Alfred Y. Cho, and Morton B. Panish It is certified that error appears in the above-identified patent and that said Letters Patent are hereby corrected as shown below:

Column 4, line 44, "Keluin" should be --Kelvin--.

Column 5, line 13, after "Group III(a)" insert --and V(a)--.

Column 5, line 19, change "temperatures" to --temperature--.

Signed and Sealed this

Second Day of November 1976

[SEAL]

Attest:

RUTH C. MASON
Attesting Officer

C. MARSHALL DANN
Commissioner of Patents and Trademarks